(12) United States Patent
Orenstein et al.

(10) Patent No.: US 6,940,878 B2
(45) Date of Patent: Sep. 6, 2005

(54) TUNABLE LASER USING MICRORING RESONATOR

(75) Inventors: Meir Orenstein, Haifa (IL); Moti Margalit, Zichron Yaagov (IL)

(73) Assignee: Lambda Crossing Ltd., Caesaria (IL)

(*) Notice: Subject to any disclaimer, the term of this patent is extended or adjusted under 35 U.S.C. 154(b) by 55 days.

(21) Appl. No.: 10/145,589

(22) Filed: May 14, 2002

(65) Prior Publication Data

US 2003/0219045 A1 Nov. 27, 2003

(51) Int. Cl.[7] ................................................ H01S 3/10
(52) U.S. Cl. ........................... 372/20; 372/92; 372/94; 372/97
(58) Field of Search ............................. 372/20, 92, 94, 372/97

(56) References Cited

U.S. PATENT DOCUMENTS

| | | | | |
|---|---|---|---|---|
| 5,991,489 A | * | 11/1999 | Kondo | 385/129 |
| 6,567,436 B1 | * | 5/2003 | Yao et al. | 372/32 |
| 6,570,893 B1 | * | 5/2003 | Libatique et al. | 372/20 |
| 6,580,532 B1 | * | 6/2003 | Yao et al. | 372/29.011 |
| 6,580,851 B1 | * | 6/2003 | Vahala et al. | 385/30 |
| 6,668,006 B1 | * | 12/2003 | Margalit et al. | 372/97 |
| 6,762,869 B2 | * | 7/2004 | Maleki et al. | 372/32 |

OTHER PUBLICATIONS

Sarlet, G., et al. "Wavelength and mode stabilization of widely tunable SG–DBR and SSG–DBR lasers", *IEEE Photonics Technology Letters*, vol. 11, No. 11 (1999) pp 1351–1353.

Park, S., et al. "Single–Mode Lasing Operation Using a Microring Resonator as a Wavelength Selector", *IEEE Journal of Quantum Electronics*, vol. 38, No. 3 (2002) pp 207–273.

Liu, B., et al. "Passive microring–resonator–coupled lasers", *Applied Physics Letters*, vol. 7, No. 22 (2001) pp 3561–3563.

Ahn, S., et al. "Grating–Assisted Codirectional Coupler Filter Using Electrooptic . . . " *IEEE Journal on Selected Topics in Quantum Electronics* vol. 7, No. 5 (2001) pp 819–825.

* cited by examiner

*Primary Examiner*—Minsun Oh Harvey
*Assistant Examiner*—Cornelius H Jackson
(74) *Attorney, Agent, or Firm*—Ladas & Parry LLP

(57) ABSTRACT

A tunable semiconductor laser device is presented. The device comprises a laser structure formed by at least two waveguides and an active region located within at least a segment of one of the waveguides; and comprises a tunable spectral filter optically coupled to the laser structure. The tunable spectral filter includes at least two filtering elements, at least one of them being a microring cavity.

28 Claims, 14 Drawing Sheets

Vernier Tuning Principle

Cross-section along dashed line

Cross-section along dashed line

Cross-section along dashed line

Cross-section along dashed line

TUNABLE LASER USING MICRORING RESONATOR

FIELD OF THE INVENTION

This invention is generally in the field of optical devices and relates to a tunable laser using a microring resonator.

BACKGROUND OF THE INVENTION

Widely tunable semiconductor lasers are important elements for next generation optical communications systems and possibly for other applications such as testing, biomedical, inspection, etc.

Current methods embedded in widely tunable semiconductor lasers are generally divided into: (1) externally tuned lasers (external cavity laser—ECL) and lasers utilizing a monolithical solution based on a distributed Bragg reflector laser (DBR)—see Table 1. In the ECL, the laser cavity is comprised of a semiconductor chip and external spectrally sensitive elements (mainly gratings) that serve as an out of chip wavelength selective mirror. Tuning of the laser is performed by rotating or modifying the external gratings (by applying an external field such as heat, stress, etc.). This type of tunable laser is problematic due to the packaging and environmental reliability of the hybrid device, and is used mainly as a laboratory device and not in optical communications systems. In lasers utilizing a monolithical solution (based on a DBR), all the laser parts are realized on a single chip. Here, two generic solutions exist:

(a) The two laser mirrors are made of sampled (SGDBR) or super structure gratings (SSGDBR) each to generate a spectral sequence of high transmission peaks (spectral comb). This is schematically illustrated in FIG. 1. The two combs of the two mirrors can be aligned by current injection such that a spectral peak of one mirror overlaps the spectral line of the other (Vernier tuning) [G. Sarlet, G. Monthier, R. Baets, "Wavelength and mode stabilization of widely tunable SG-DBR and SSG-DBRlasers", IEEE Photonics Technology Letters, Vol. 11 no. 11 1999 pp 1351].

(b) Grating-Assisted Codirectional Coupler with Sampled Reflector (GCSR). One laser mirror is comprised of sampled or super structure gratings and the laser active region is coupled to this mirror via a narrow bandpass filter (realized as a long period grating assisted coupler). This is schematically illustrated in FIG. 2. The tuning is performed by current injection to the sampled, superstructure gratings and the bandpass filter is tuned (also by current injection) to overlap one of the spectral reflectivity peaks of the mirror.

SUMMARY OF THE INVENTION

The present invention relates to a monolithically integrated tunable laser, in which at least one microring resonator is used (replacing the superstructure gratings in the conventional devices of the kind specified) to generate a spectral comb of frequencies. By this, the main shortcomings of both conventional monolithical methods can be overcome.

The term "microring resonator" refers to (a) any configuration where light follows a closed loop path: circular, elliptical or any other annular structure; and (b) any microcavity circular, elliptical square or any shape disk structure.

Some of the benefits of using microring resonators are:

1. The spectral transmission of gratings consists of a single transmission peak. To generate the required sequence of spectral peaks, complex gratings have to be employed (variable period, segments of different periods etc.) This is accomplished by a difficult fabrication process having adverse effects on yields and prices. Microring resonators generate by nature a periodic sequence of spectral peaks.

2. The fabrication of gratings necessitates very fine lithography (sub 0.25 micrometer lines and spacings), which can be performed only by expansive, special tools (e.g. direct e-beam writing) while microring resonators can be defined by conventional lithography of 1 $\mu$m lines and slightly below 1 micron spacing.

3. Sampled or super structure gratings are usually long (~1 mm) while the ring dimension (diameter) can be much smaller (10 to 100 $\mu$m). This reduces significantly the overall laser size.

4. The microring resonator can be employed as a mirror, intracavity filter etc. resulting in a higher level of design flexibility and configuration variety.

The present invention provides for a tunable semiconductor laser in which a part of a tuning element is a microring cavity coupled to a laser structure, and serves as a tunable spectral sequence filter. This is different from prior art microring based devices, since there a laser itself is implemented as a microring, or an external ring is used for improving the spectral quality of a laser, but not for tuning (S. Park, Seong-Soo Kim, L. Wang, and Seng-Tiong Ho "Single-Mode Lasing Operation Using a Microring Resonator as a Wavelength Selector", IEEE J. of QUANTUM ELECTRONICS, VOL. 38, NO. 3, 2002, pp. 207; B. Liu, A. Shakouri, and J. E. Bowers "Passive microring-resonator coupled lasers", Applied Physics Letters, Vol. 79, Num. 22, 2001, pp. 3561.

Thus, according to a broad aspect of the present invention, there is provided a tunable semiconductor laser device comprising a laser structure formed by at least two waveguides and an active region located within at least a segment of one of the waveguides; and a tunable spectral filter optically coupled to the laser structure, said tunable spectral filter including at least two filtering elements, at least one of the filtering elements being a microring cavity.

The coupled microring may filter a frequency comb, and an additional tunable bandpass filter can be used to select a specific frequency of the comb. In this case, the coupled microring can be large to generate a frequency comb with the required spacing. Here, the microring can be fixed and only the bandpass filter has to be tuned. The bandpass filter may be implemented as another small microring, or a grating assisted coupler that transfers light of a specific frequency band from one output of the coupler to the other (e.g., "Grating-Assisted Codirectional Coupler Filter Using Electrooptic and Passive Polymer Waveguides", Seh-Won, Ahn and Sang-Yung Shin, IEEE Journal on Selected Topics in Quantum Electronics, Vol. 7, No. 5, September/October 2001, pp. 819–825).

The diameter of the coupled microring can be relatively small such that the spacing between the comb frequencies is larger than required, and a tuning mechanism of the ring is utilized such that the frequency comb can be tuned to intermediate frequencies. Similarly, the bandpass filter may be implemented as another smaller ring, or a grating assisted coupler.

The coupled microring can filter a frequency comb and an additional filter can be used to filter another frequency comb with a different spectral spacing. The tuning is preferably performed using the Vernier effect. The additional filter may be another microring, a sampled grating, or superstructure gratings. Alternatively, the additional filter may be another microcavity, e.g. Fabry Perot microcavity. The tuning mechanism can be thermal, current injection, electro-optic etc.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

Figure 1:
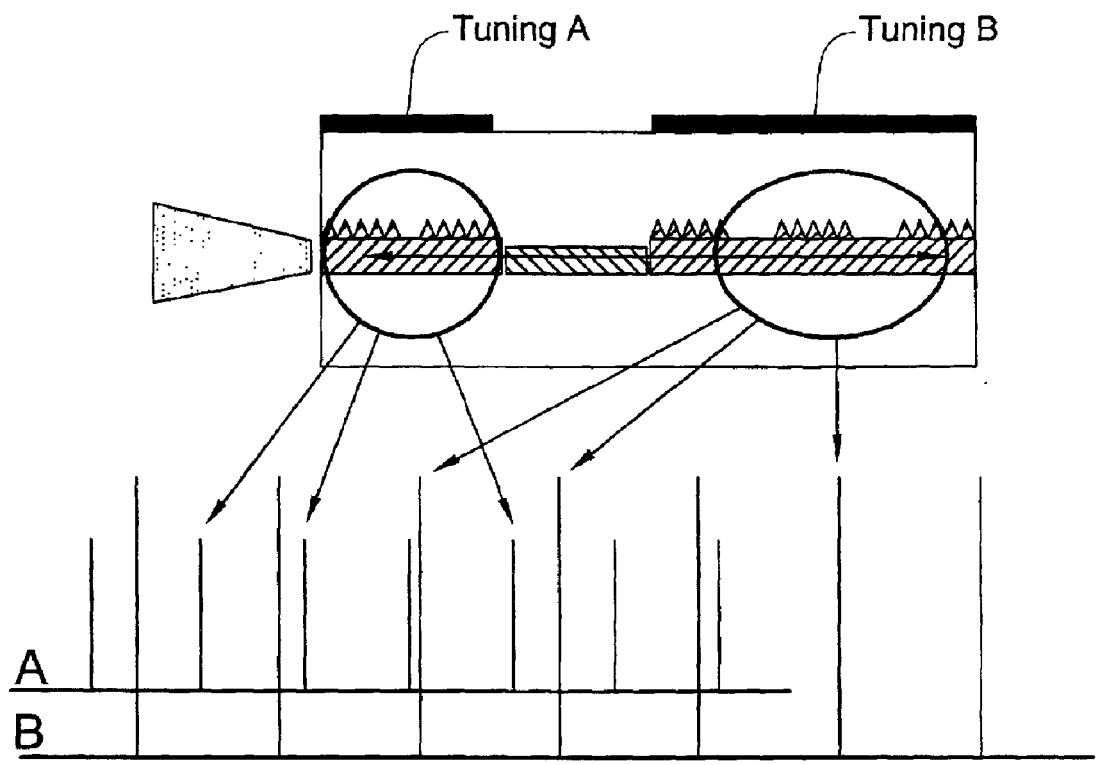
FIG. 1 is a schematic illustration of a prior art SGDBR- or SSGDBR-based laser utilizing Vernier Tuning Principle.
Figure 2:
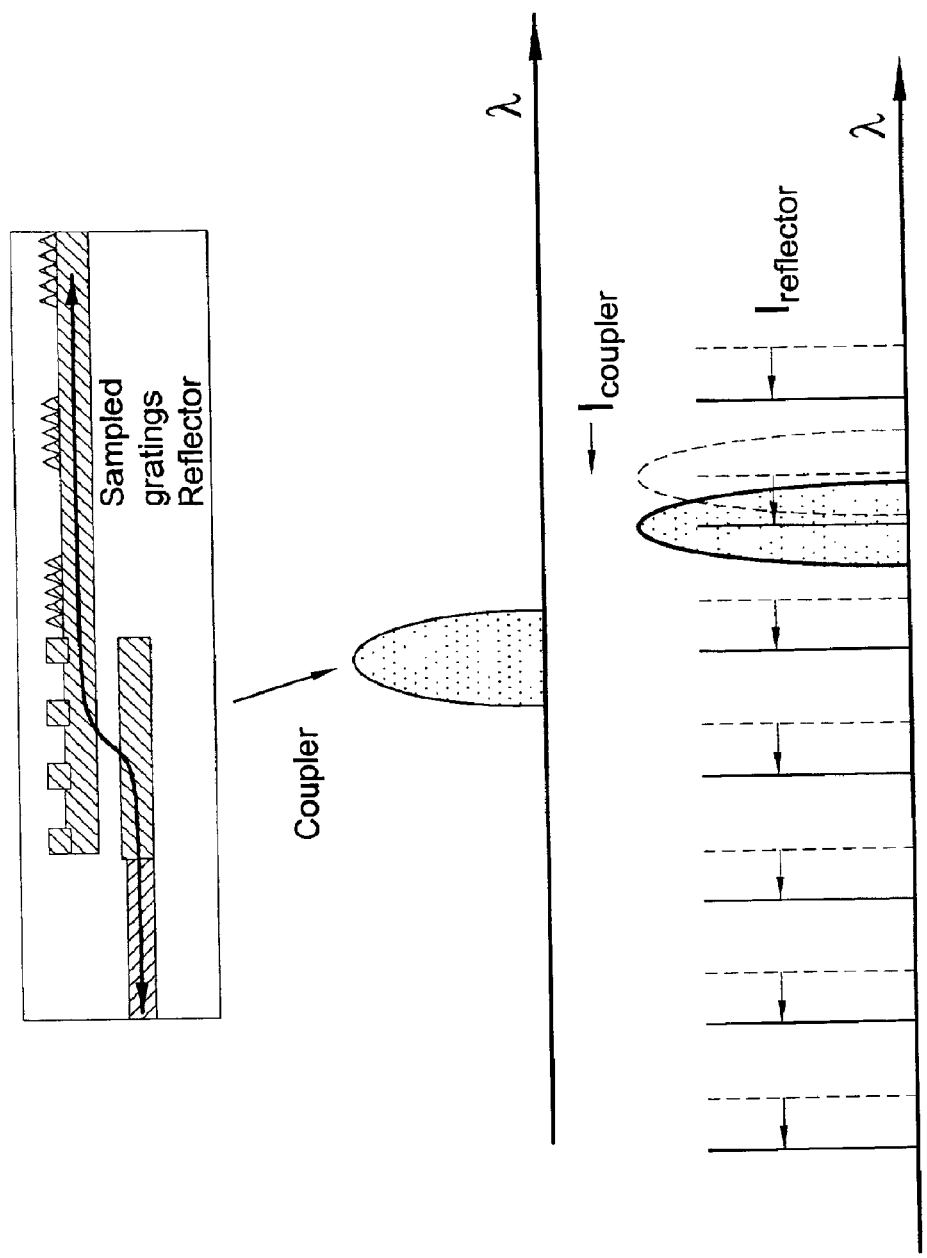
FIG. 2 is a schematic illustration of a prior art CGSR-based laser.

FIGS. 1 and 2 show prior art laser devices lasers of the kind utilizing the monolithical solution (based on a DBR). Laser structures according to the invention utilize microring resonators instead of at least superstructure or sampled gratings. The lasers can be fabricated by an epitaxial growth on InP, or other materials. In the non-limiting examples presented below, the InP based lasers that dominate the optical communications lasers are emphasized. The active laser layer and waveguide is referred to as 1.55 layers (the material composition made to emit light at 1.55 micrometer). Other waveguide layers are denoted as a 1.3 layer and a 1.14 layer, both transparent to the laser wavelength. They are deposited by a process of epitaxial regrowth over the processed wafer.

Figure 3A:
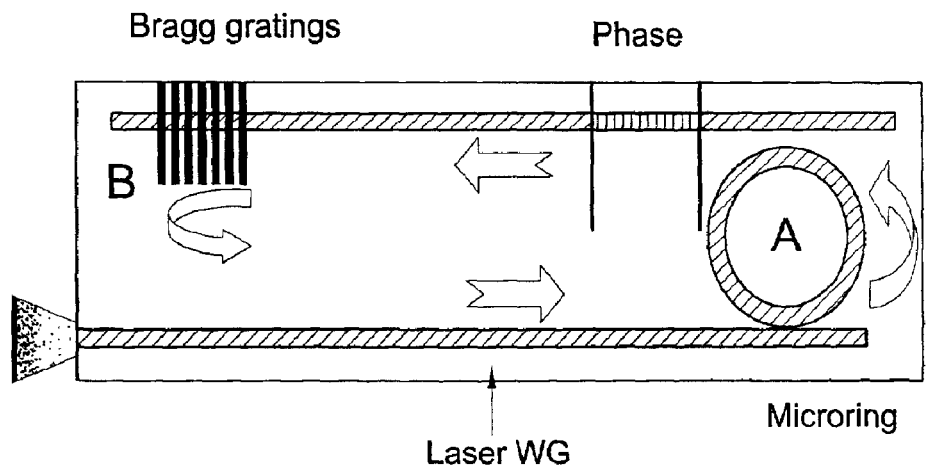
FIG. 3 schematically illustrates a laser device according to one embodiment of the invention.
Figure 3B:
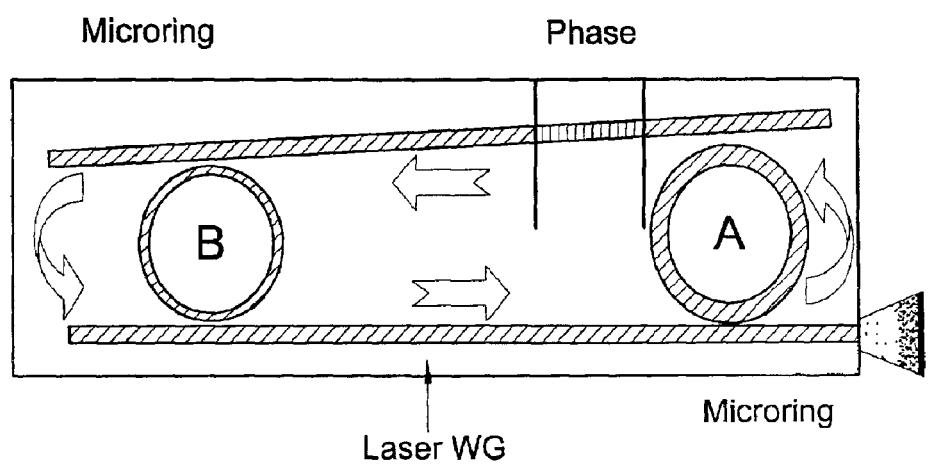

Referring to FIGS. 3A and 3B, a laser structure according to one embodiment of the present invention is schematically illustrated. This configuration is generally similar to the prior art SGDBR or SSGDBR structures, but differs therefrom in that one of the two gratings (FIG. 3A) or both of them (FIG. 3B) is replaced by microring resonator(s). Imposing a small difference between the free spectral range of the ring and the second tuning element (another microring or Bragg grating) results in Vernier turning. This difference can be generated by a material selection or by size difference.

Figure 4A:
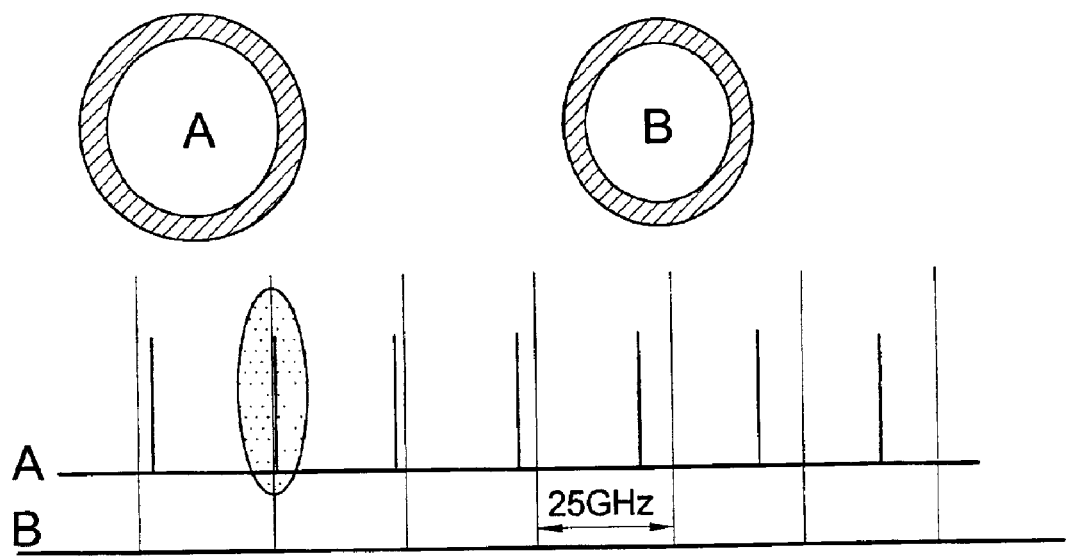
FIGS. 4A and 4B illustrate the tuning principles utilized in the device of FIGS. 3A–3B.
Figure 4B:
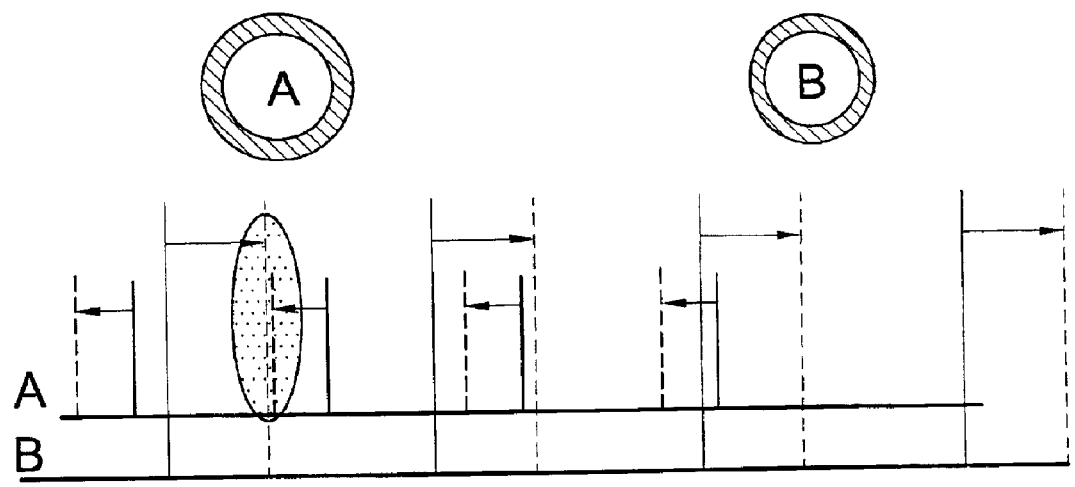

FIGS. 4A and 4B illustrate more specific designs of the above configuration. The example of FIG. 4A shows that the diameter of the microring resonator can be selected such that the spacing of the spectral peaks (the "free spectral range" or FSR) can be the actual spacing required from the laser (e.g. 25 GHz). A large ring is required to accomplish this feature. Here, the tuning is performed only by a very slight tuning of the rings relatively to each other to apply the Vernier effect, and due to this small tuning, only a very small amount of power (current) is required. Thus, by using a large ring with small FSR, the small tuning is required only for the Vernier effect. The example of FIG. 4B shows that the ring can be made smaller, such that the free spectral range is higher (e.g. 200 GHz). In this case, to address each spectral line (e.g. the same 25 GHz grid), one has to tune the spectralsequence to the selected spectral line (8 such lines within the 200 GHz) and then select a single line by the Vernier effect. In other words, by using a smaller ring with higher FSR, the tuning is required both for shifting the comb and for the Vernier effect. This flexibility does not exist for the sampled or superstructure lasers, because implementation of e.g. 25 GHz spaced spectral lines over the band of interest will require the implementation of about 150 different grating periods, which is not feasible in manufacturing, since the most commonly implemented sampled gratings support 5000 Hz spacing. However, rings that support a dense comb of frequencies are large rings that are very easy to fabricate. This configuration is best implemented if rings are realized as a passive waveguide structure to allow for current tuning. FIGS. 5A–5E show some examples of suitable configurations of the current embodiment of the invention. In the figures, 1.55 layer is an active layer, 1.3 and 1.14 Layers are passive layers. The phase element is a conventional element in DBR like lasers and its functionality is to match the overall phase of the laser cavity.

Figure 5A:
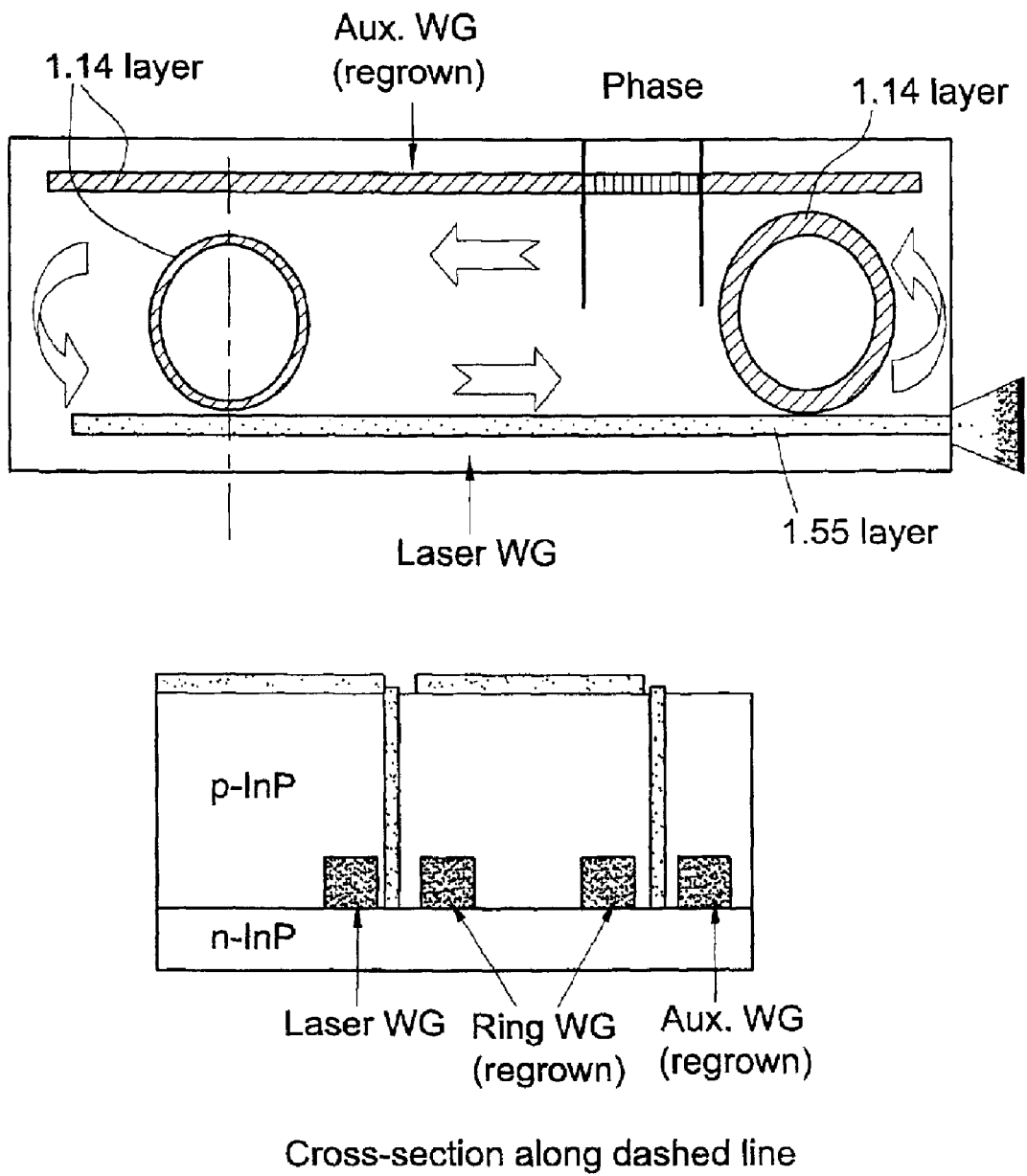
FIGS. 5A to 5E exemplify several specific designs of the laser device of FIGS. 3A–3B.
Figure 5B:
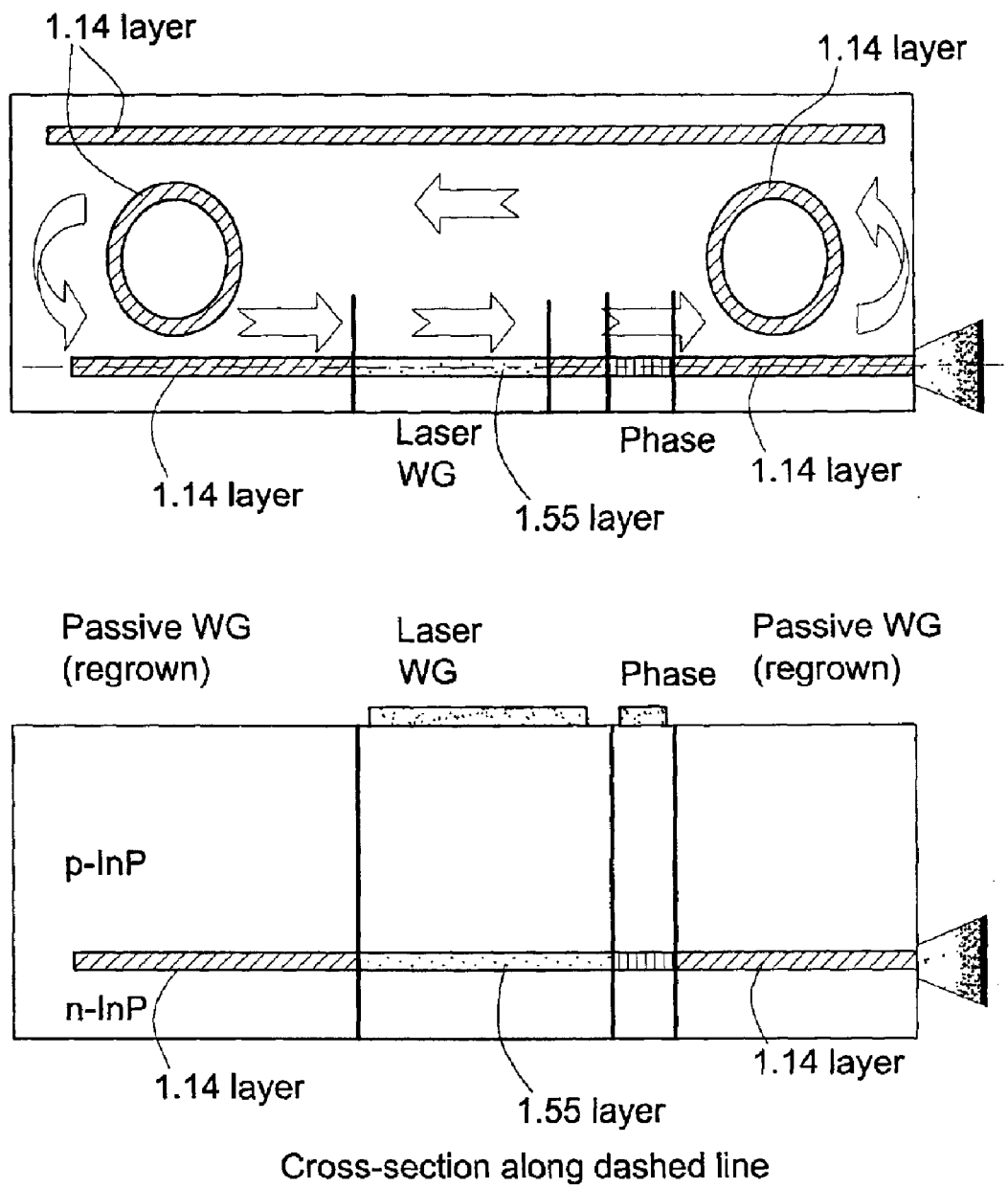
Figure 5C:
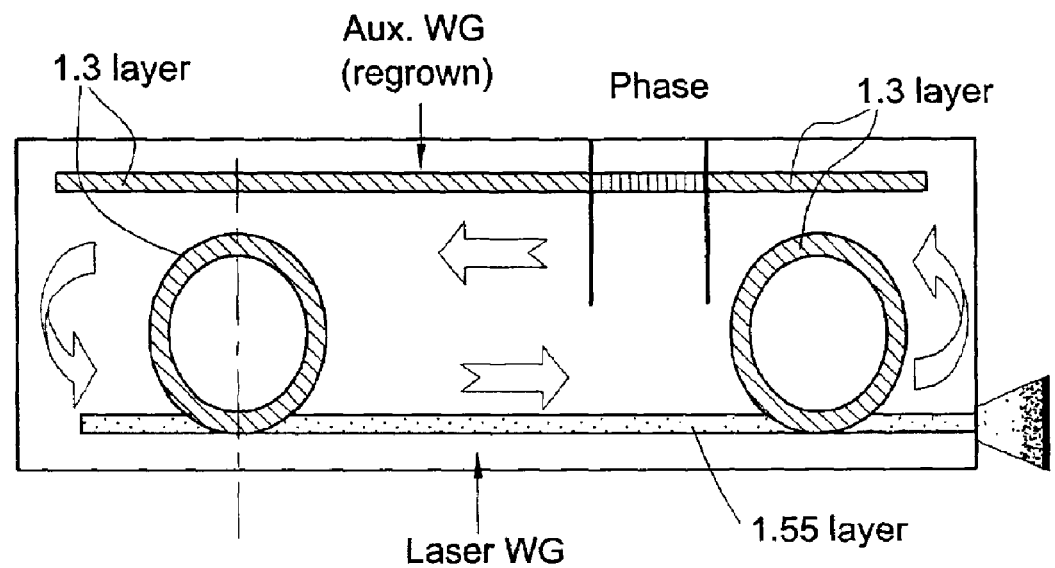
Figure 5C:
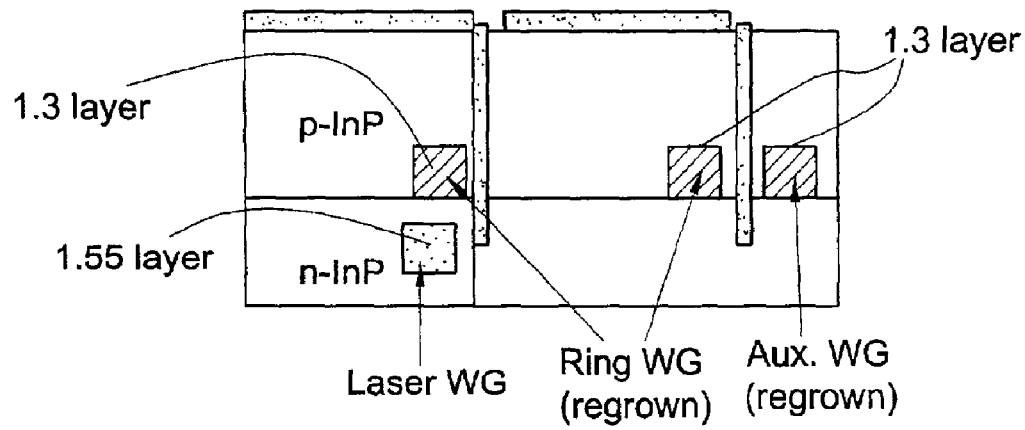
Figure 5D:
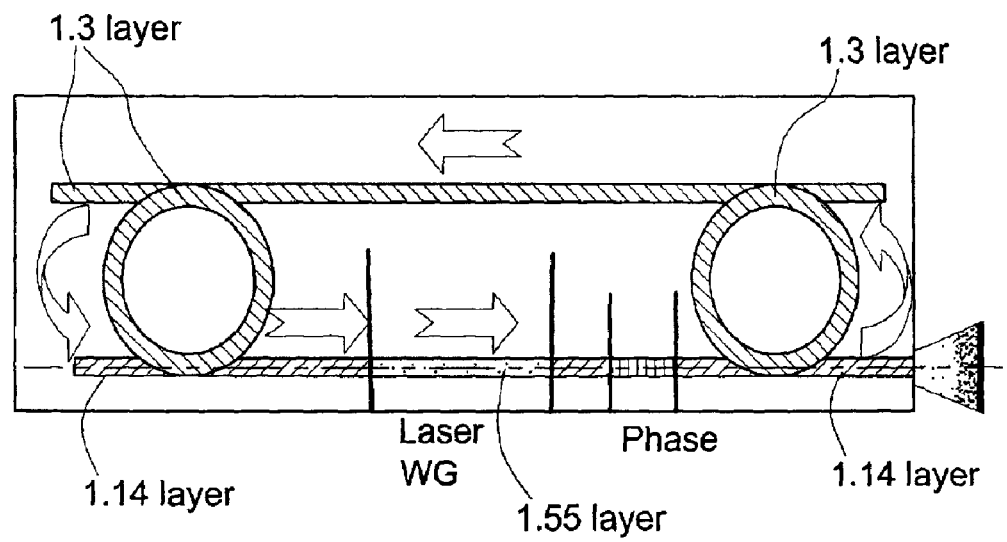
Figure 5D:
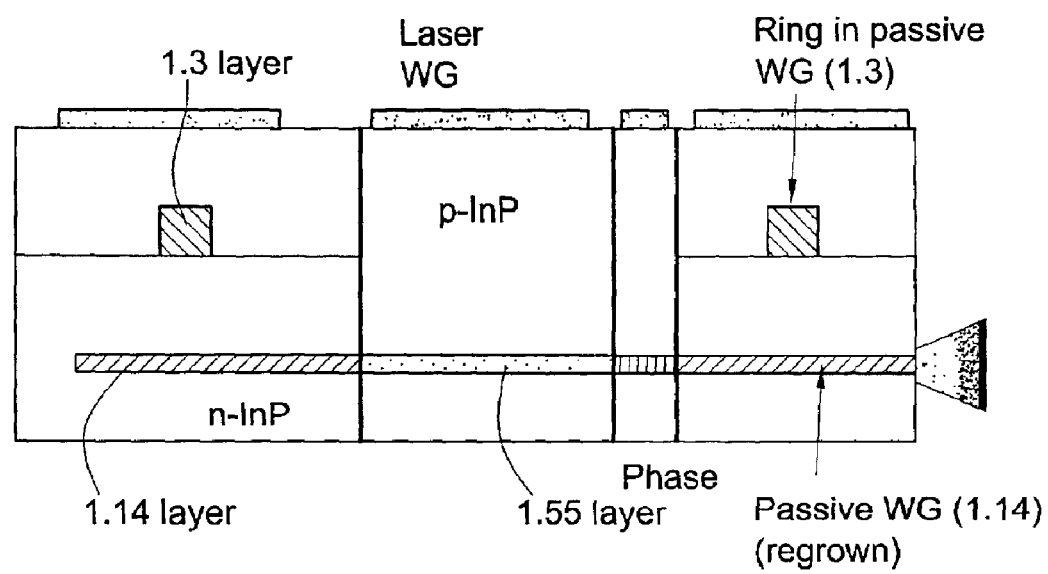
Figure 5E:
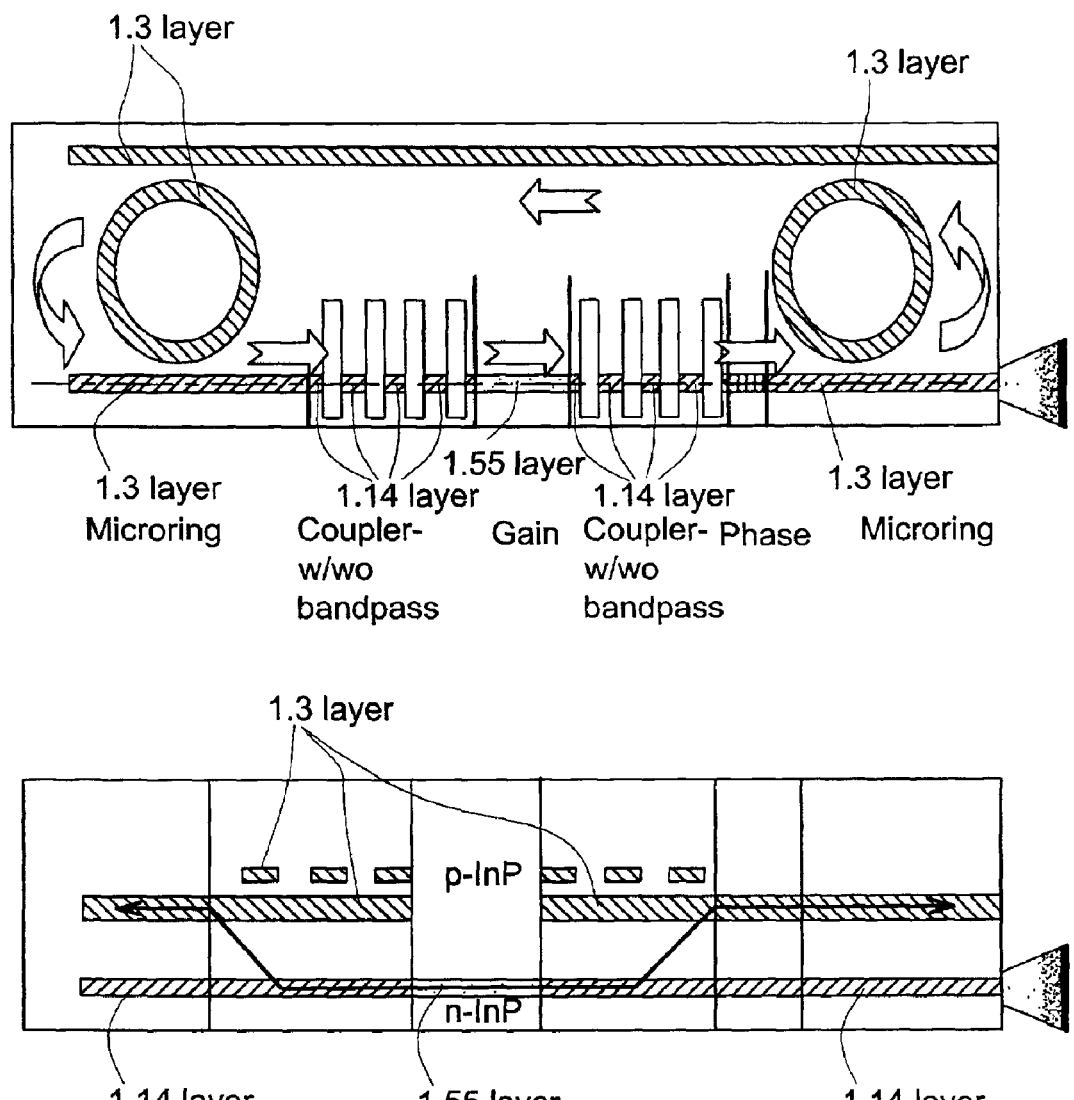

In the example of FIG. 5A, passive rings (e.g. 1.14 layer) are horizontally coupled to laser waveguide (1.55 layer) and a passive or auxiliary waveguide (e.g., the same 1.14 layer of the rings) is coupled to the passive rings. In the example of FIG. 5B, passive rings (e.g. 1.14 layer) are horizontally coupled to passive waveguides (e.g., 1.14 layer), which are the continuation of the laser active waveguide (1.55 layer). According to the example of FIG. 5C, passive rings (1.3. layers) are directly vertically coupled to the laser waveguide (1.55 layer). FIG. 5D exemplifies passive rings (1.3. layer) coupled vertically to the passive continuation (1.14 layer) of the laser waveguide (1.55 layer). The vertical coupling can be wavelength independent or dependent. In FIG. 5E, passive rings (1.3 layer) are coupled horizontally or vertically to passive waveguides (1.3 layer), and the latter are vertically coupled to either the laser waveguide (1.55 layer) or the passive waveguides (1.14 layer) that are continuations of the laser waveguide. A coupler with or without (w/wo) spectral bandpass can be used, namely, a coupler either with an additional filtering element or without spectral characteristics.

Figure 6:
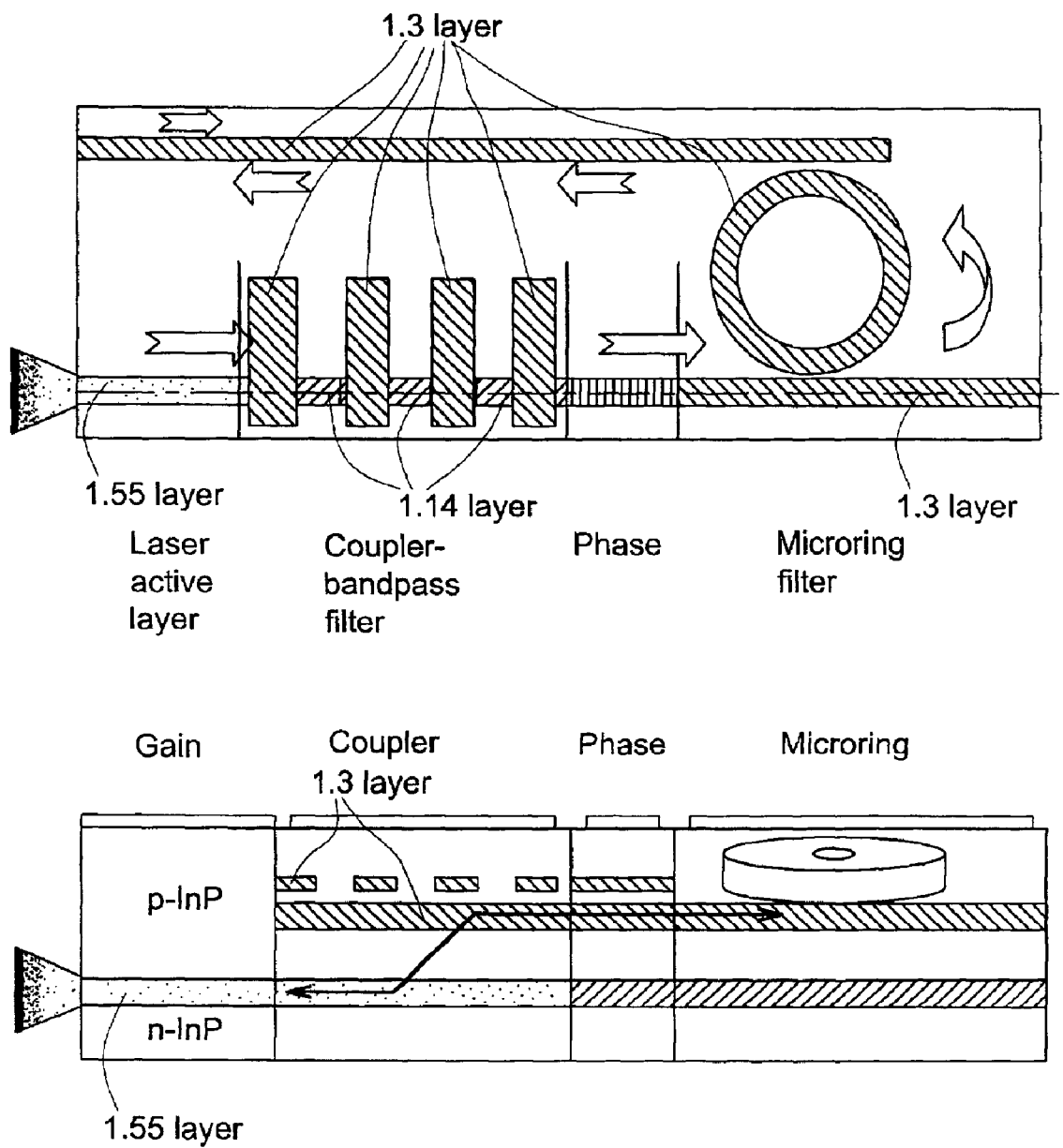
FIGS. 6 and 7A–7B are schematic illustrations of laser devices according to another embodiment of the invention.

Reference is now made to FIG. 6 showing a laser structure according to another embodiment of the invention. This configuration is generally similar to the prior art GCSR structure, but differs therefrom in that the sampled or superstructure grating is replaced by a ring cavity. Similar to the examples of the previously described embodiment, in the embodiment of FIG. 6, the diameter of the microring resonator can be selected such that the spacing of tile spectral peaks (the "free spectral range") can be the actual spacing required from the laser (e.g. 25 GHz). Here, in distinction to the previous examples, the tuning can be performed by a slight tuning of the bandpass filter only. Due to the slight tuning, only a very small amount of power (current) is required. The ring can be made smaller, such that the free spectral range is higher (e.g. 200 GHz). In this case, to address each spectral line (e.g., on the same 25 GHz grid), one has to tune the ring in order to shift the spectral sequence to the selected spectral line (8 such lines within the 200 GHz) and then shift the bandpass filter accordingly. This flexibility does not exist for the sampled or superstructure, because the implementation of 25 GHz spaced lines over the entire frequency band of interest (e.g. the band of optical communication) requires about 150 different grating periods which is not feasible in manufacturing. The ring that supports this feature, is a large ring that is very easy to fabricate.

Since the ring filter cannot be used directly as a mirror, one has to provide a pass for the light to be coupled back to the laser cavity. It should be noted, although not specifically shown, that the device of FIG. 6 can be terminated with gratings (on the top WG) similar to that of FIG. 3A.

Figure 7A:
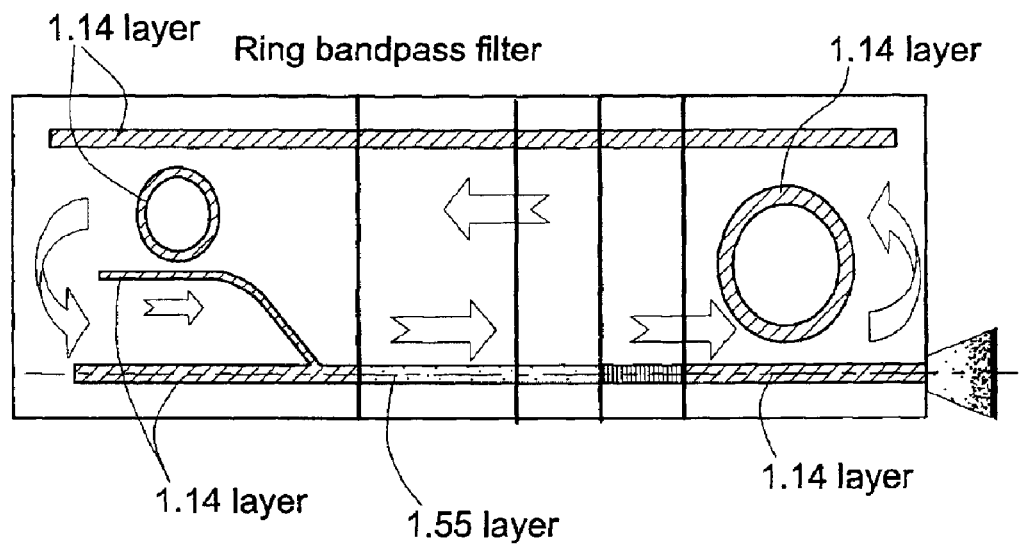
Figure 7B:
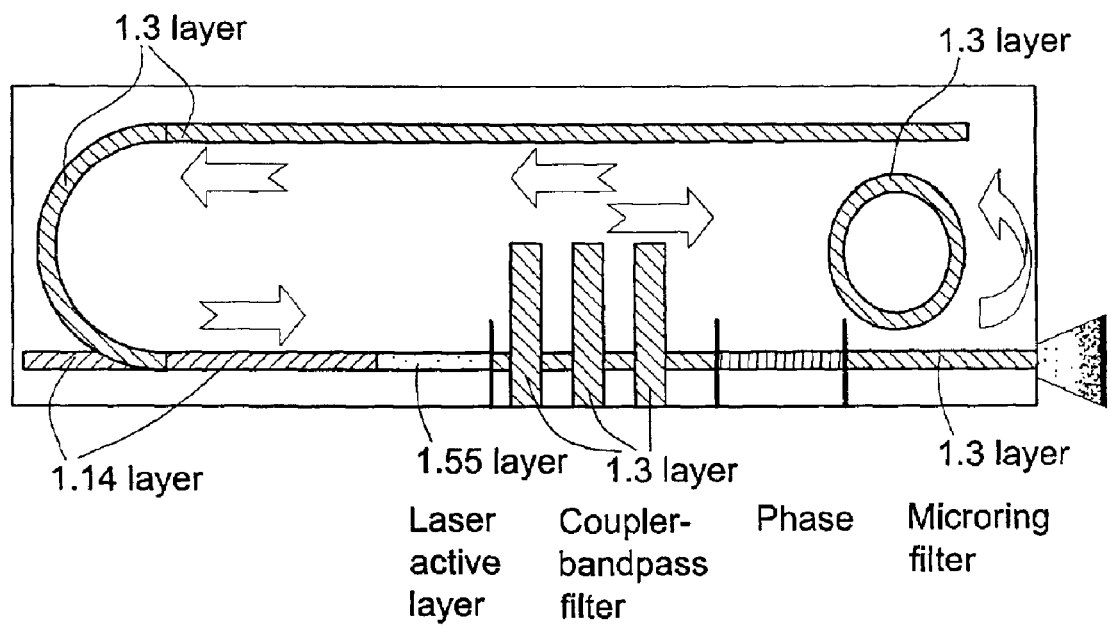

The principles of the embodiment of FIG. 6 have several possible implementations. According to one of them, the device may be generally similar to the CGSR configuration but with a ring replacing the sampled gratings, and using the facet as a reflector. Other possible implementations are shown in FIGS. 7A and 7B. In the example of FIG. 7A, in addition to the most general configuration of FIG. 6, the bandpass filter is replaced by a small ring (with large FSR). This allows also direct back coupling to the laser without the use of the facet reflector. In the example of FIG. 7B, an arc segment is used for directly returning the filtered light back into the laser waveguide, thus eliminating the need for facet or gratings reflection.

Figure 8A:
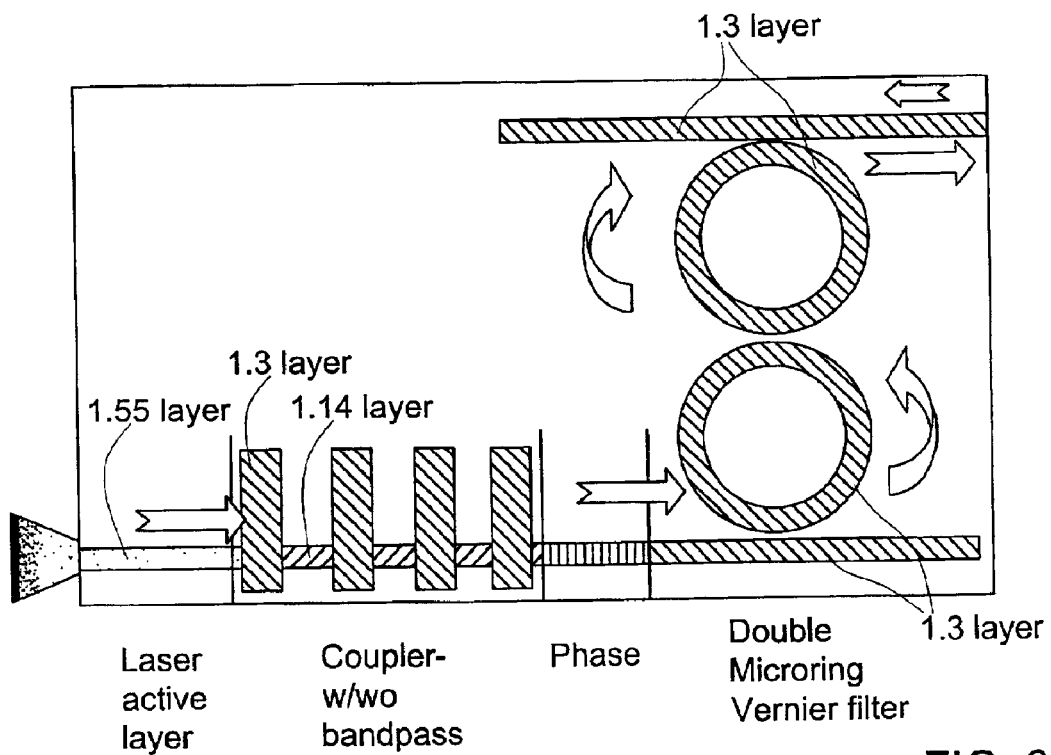
FIGS. 8A to 8D are schematic illustrations of yet another embodiment of the invention.
Figure 8B:
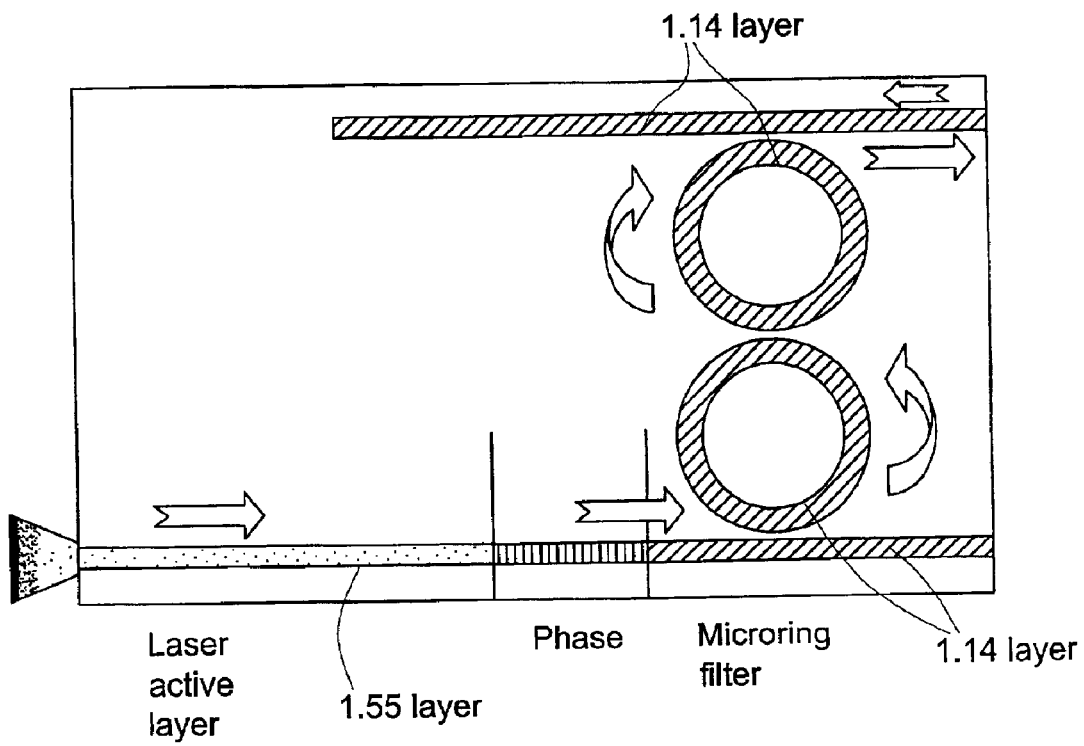
Figure 8C:
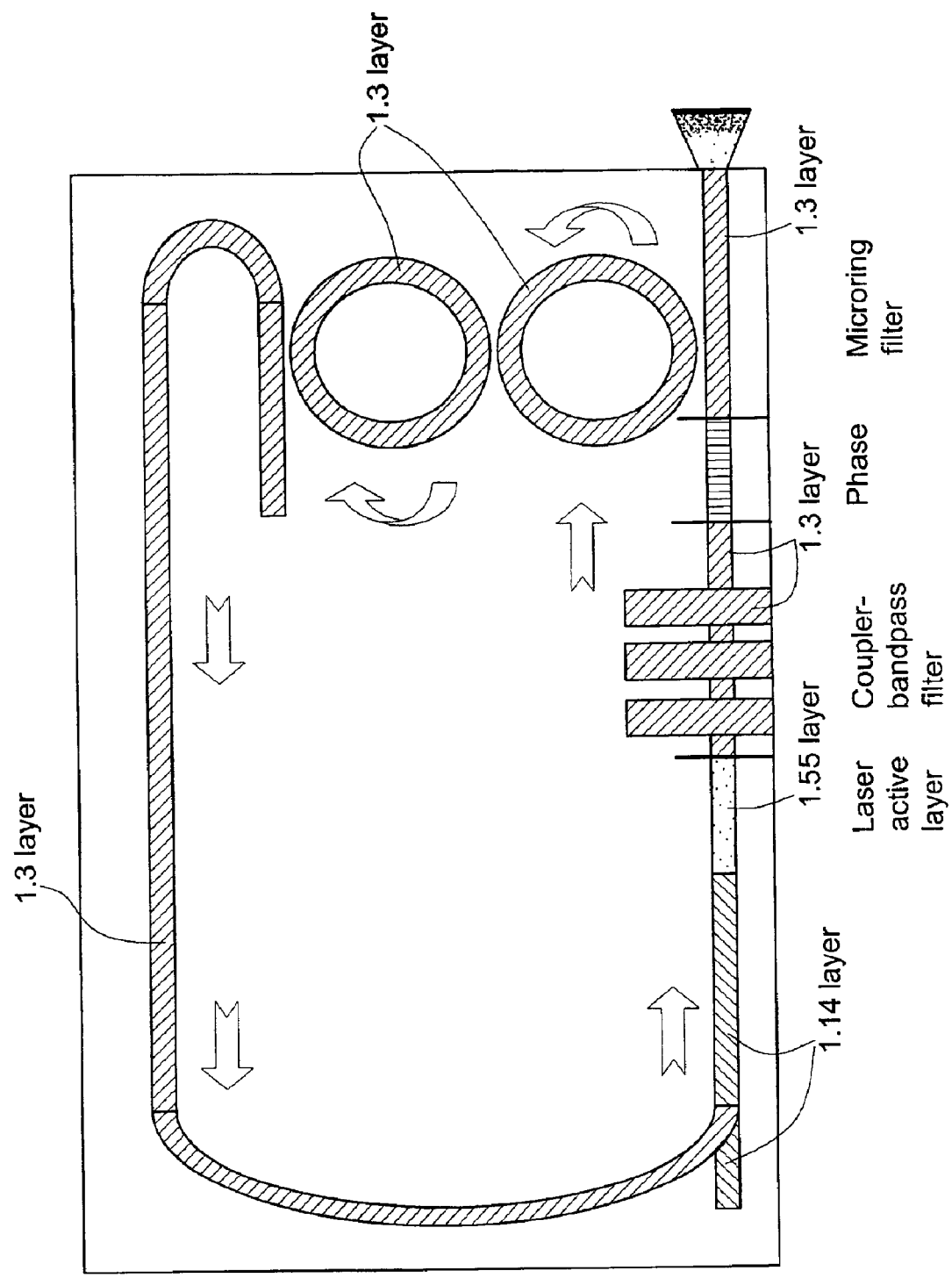
Figure 8D:
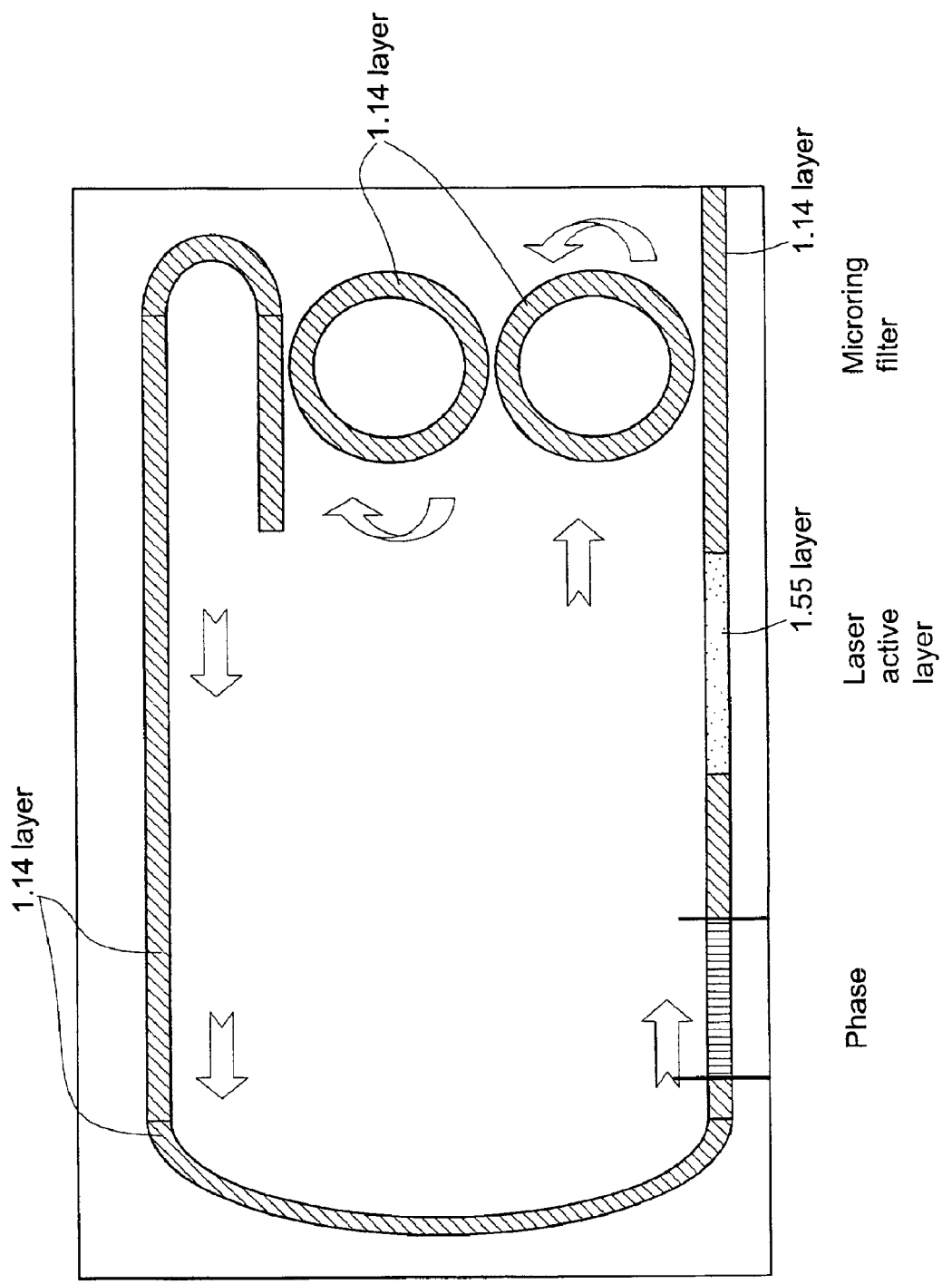

Turning now to FIGS. 8A to 8D, there are illustrated four designs, respectively, of a laser device according to yet another embodiment of the invention utilizing a tunable filter within the laser cavity. Here, the Vernier effect is implemented by a dual ring based tunable filter (at least two rings are required but more rings can be used as well) located on the right side of the top waveguide. This tunable filter module replaces the functionality of the two separated ring mirrors of the configuration of FIG. 3. In the examples of FIGS. 8A and 8B, facet reflection is utilized, while the devices of FIGS. 8C and 8D need no facet reflection due to the use of an arc segment.

Those skilled in the art will readily appreciate that various modification and changes can be applied to the embodiments of the invention as hereinbefore exemplified without departing from its scope defined in and by the appended claims.

TABLE 1

Tunable Laser Technology Approaches
Source: the Yankee Group, 2001

| Technology | Tuning Range | Output Power | Switching Speed | Manufacturing Process | Laser Cost | Applications |
| --- | --- | --- | --- | --- | --- | --- |
| DFB | Narrow | High | Low | Established | Medium | Long Haul, Ultra Long Haul |
| DBR | Modest | High | Low | Established | Medium | Metro, Long Haul |
| → SGDBR | Wide | Medium | Medium | Evolving | Medium | Metro, Long Haul |
| → SSGDBR | Wide | Low | Medium | Evolving | High | Metro |
| GGSR | Wide | Medium | Medium | Evolving | Mediun | Metro, Long Haul |
| VCSEL | Wide | Low | Low | Evolving | Low | Metro |
| → ECL | Wide | High | Low | Evolving | Medium | Long Haul, Ultra Long Haul |

What is claimed is:

1. An integrated tunable semiconductor laser device, wherein a laser cavity of the device is formed as a waveguide structure comprising: at least two spaced-apart waveguides with an active gain region located within at least a segment of one of said at least two waveguides, and a phase element located within a said segment of one of said at least two waveguides and operative to match the overall phase of the laser cavity; and a tunable spectral filter including at least two filtering elements, at least one of said filtering elements including a closed loop waveguide constituted as a microring cavity accommodated between said two spaced-apart waveguides for coupling light in between said two spaced-apart waveguides and operable as a tunable spectral sequence filtering element.

2. The device according to claim 1, wherein said two space-apart waveguides are optically coupled to each other by an arc segment to return filtered light back to the active region.

3. The device according to claim 1, wherein the filtering elements are configured to enable affecting a small difference between free spectral ranges (FSRs) of said filtering elements, thereby tuning the device by Vernier effect.

4. The device according to claim 3, wherein the filtering elements have different dimensions thereby creating said small difference between their FSRs.

5. The device according to claim 3, wherein the filtering elements are made of different materials thereby creating said small difference between their FSRs.

6. The device according to claim 1, wherein the microring cavity filtering element is configured to filter a first frequency comb, and another of said at least two filtering elements is configured to filter a second frequency comb with a spectral spacing different from that of the first frequency comb.

7. The device according to claim 6, operable to perform frequency tuning using the Vernier effect.

8. The device according to claim 6, wherein the other filtering element is an additional microring cavity structure.

9. The device according to claim 6, wherein the other filtering element is a Fabry Perot microcavity.

10. The device according to claim 6, herein the other filtering element includes sampled grating or superstructure gratings.

11. The device according to claim 1, wherein the microring cavity filtering element is configured to filter a frequency comb, and another of said at least two filtering elements is configured for bandpass filtering by selecting a specific frequency from the filtered frequency comb.

12. The device according to claim 11, wherein dimensions of said microring cavity provide for generating the frequency comb with a spacing between filtered frequency components substantially equal to that required for output of the laser device.

13. The device according to claim 12, wherein said bandpass filtering element is tunable.

14. The device according to claim 13, wherein said bandpass filtering element is a grating assisted coupler.

15. The device according to claim 13, wherein said bandpass filtering element is an additional microring cavity, the two microring cavities being accommodated in a cascaded manner between two linear segments of the two spaced-apart waveguides, respectively.

16. The device according to claim 13, wherein said bandpass filtering element is an additional microring cavity, the two microring cavities being accommodated between the two spaced-apart waveguides so as to be optically coupled thereto and to each other.

17. The device according to claim 16, wherein said additional microring cavity has smaller dimensions than said microring cavity.

18. The device according to claim 16, wherein the two microring cavities and the active region containing waveguide are located in the same layer of the integrated device being thus horizontally coupled to the active region containing waveguide.

19. The device according to claim 16, wherein the microring cavities are horizontally coupled to the waveguide containing said active region through segments of said waveguide outside the active region.

20. The device according to claim 16, wherein the microring cavities and the active region containing waveguide are located in different layers of the integrated device and are directly vertically coupled to the active region waveguide.

21. The device according to claim 16, wherein the microring cavities and the active region containing waveguide are located in different layers of the integrated device and are vertically coupled to the waveguide containing the active region through segments of said waveguide outside said active region.

22. The device according to claim 16, comprising an additional coupler element for optically coupling the microring cavities to the waveguide containing said active region.

23. The device according to claim 22, wherein said additional coupler element has a bandpass filtering function.

24. The device according to claim 16, wherein the microring cavities are coupled to the waveguide segments outside the active region, and said segments are vertically coupled to the waveguide containing said active region through segments of said waveguide outside the active region.

25. The device according to claim 24, comprising an additional coupler element for optically coupling the microring cavities to the waveguide containing said active region.

26. The device according to claim 25, wherein said additional coupler element has a bandpass filtering function.

27. A method of fabricating an integrated tunable semiconductor laser device, the method comprising forming a laser cavity as a waveguide structure including two spaced-apart waveguides with an active region being located within at least a segment of one of the waveguides and with a phase element being located in a segment of one of said at least two waveguides to match the overall phase of the laser cavity, and configuring a tunable spectral filter from at least two microring cavities accommodated between the two spaced-apart waveguides and being optically coupled to said at least two waveguides and to each other, to thereby provide for coupling light in between the two spaced-apart waveguides and enable tuning of the device by tuning the microring cavities relatively to each other to apply a Vernier effect.

28. An integrated tunable semiconductor laser device having a laser cavity comprising at least two waveguides with an active gain region being located within at least a segment of one of said at least two waveguides; a phase element located in a region of one of said at least two waveguides and operating to match the overall phase of the laser cavity; and a tunable spectral sequence filter including at least two closed loop waveguides presenting microring cavities that are accommodated between said two spaced-apart waveguides coupling light propagation therebetween while effecting tunable spectral sequence filtering, the device being tunable by tuning the microring cavities relatively to each other to thereby apply a Vernier effect.

* * * * *